(12) United States Patent
Eom

(10) Patent No.: US 11,443,697 B2
(45) Date of Patent: Sep. 13, 2022

(54) DRIVING CIRCUIT AND DISPLAY DEVICE INCLUDING THE SAME

(71) Applicant: Samsung Display Co., Ltd., Yongin-si (KR)

(72) Inventor: Ki-Myeong Eom, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/191,607

(22) Filed: Mar. 3, 2021

(65) Prior Publication Data
US 2021/0193051 A1 Jun. 24, 2021

Related U.S. Application Data

(60) Continuation of application No. 15/589,948, filed on May 8, 2017, now Pat. No. 10,943,538, which is a
(Continued)

(30) Foreign Application Priority Data

Feb. 14, 2014 (KR) .......................... 10-2014-0017471

(51) Int. Cl.
*G09G 3/30* (2006.01)
*G09G 3/3266* (2016.01)
(Continued)

(52) U.S. Cl.
CPC ......... *G09G 3/3266* (2013.01); *G09G 3/3233* (2013.01); *G09G 3/3258* (2013.01);
(Continued)

(58) Field of Classification Search
CPC .. G09G 3/3266; G09G 3/3233; G09G 3/3258; G09G 3/3291; G09G 2300/0426;
(Continued)

(56) References Cited

U.S. PATENT DOCUMENTS 5,801,960 A 9/1998 Takano et al.
8,004,178 B2 8/2011 Lee
(Continued)

FOREIGN PATENT DOCUMENTS

CN 101145398 A 3/2008
CN 102385835 A 3/2012
(Continued)

OTHER PUBLICATIONS

Korean Notice of Allowance dated Dec. 29, 2021, issued in Korean Patent Application No. 10-2021-0013454 (5 pages).

*Primary Examiner* — Mark W Regn
(74) *Attorney, Agent, or Firm* — Lewis Roca Rothgerber Christie LLP

(57) ABSTRACT

Provided is a scan driving circuit including a plurality of unit scan driving circuits, at least one of the plurality of unit scan driving circuits including: a first transistor configured to receive a prior scan signal in synchronization with a first clock signal and to respond to an enable level of the prior scan signal to output a second clock signal as a corresponding scan signal during one cycle of the first clock signal; a second transistor coupled between the first transistor and a first voltage; and a third transistor coupled to a gate of the second transistor and configured to be turned on by a first signal. A width of a first wire configured to transfer the first clock signal and a width of a second wire configured to transfer the second clock signal are larger than that of a third wire configured to transfer the first signal.

20 Claims, 10 Drawing Sheets

Related U.S. Application Data division of application No. 14/340,142, filed on Jul. 24, 2014, now Pat. No. 9,646,539.

(51) Int. Cl.

| | | |
|---|---|---|
| *G09G 3/3233* | (2016.01) | |
| *G09G 3/3258* | (2016.01) | |
| *G09G 3/3291* | (2016.01) | |
| *H01L 27/32* | (2006.01) | |
| *H01Q 9/04* | (2006.01) | |
| *H01Q 19/00* | (2006.01) | |
| *H01Q 19/13* | (2006.01) | |
| *H01L 27/12* | (2006.01) | |

(52) U.S. Cl.
CPC ....... *G09G 3/3291* (2013.01); *H01L 27/3262* (2013.01); *H01L 27/3279* (2013.01); *H01Q 9/0407* (2013.01); *H01Q 19/00* (2013.01); *H01Q 19/13* (2013.01); *G09G 2300/0426* (2013.01); *G09G 2300/0842* (2013.01); *G09G 2300/0861* (2013.01); *G09G 2310/0251* (2013.01); *G09G 2310/08* (2013.01); *G09G 2330/023* (2013.01); *H01L 27/124* (2013.01)

(58) Field of Classification Search
CPC ... G09G 2300/0842; G09G 2300/0861; G09G 2310/0251; G09G 2310/08; G09G 2330/023; H01L 27/3262; H01L 27/3279; H01L 27/124; H01Q 9/0407; H01Q 19/00; H01Q 19/13
See application file for complete search history.

(56) References Cited

U.S. PATENT DOCUMENTS

| | | |
|---|---|---|
| 9,177,502 B2 | 11/2015 | Jang et al. |
| 9,684,215 B2 | 6/2017 | Umezaki |
| 10,088,725 B2 | 10/2018 | Umezaki |
| 10,606,140 B2 | 3/2020 | Umezaki |
| 2005/0083474 A1* | 4/2005 | Park ................ G02F 1/13452 349/151 |
| 2008/0006207 A1 | 1/2008 | Miyagawa et al. |
| 2008/0062071 A1 | 3/2008 | Jeong |
| 2008/0252203 A1* | 10/2008 | Lee ................ H01L 27/3276 313/504 |
| 2012/0050234 A1* | 3/2012 | Jang ................ G09G 3/3225 345/204 |
| 2012/0075259 A1 | 3/2012 | Chung |
| 2012/0081409 A1 | 4/2012 | Chung |
| 2012/0105412 A1 | 5/2012 | Kang et al. |
| 2012/0181539 A1 | 7/2012 | Han et al. |
| 2013/0002306 A1 | 1/2013 | Chung |
| 2013/0050161 A1 | 2/2013 | Park et al. |
| 2013/0075711 A1 | 3/2013 | Kanegae |
| 2014/0355733 A1 | 12/2014 | Kim et al. |
| 2020/0241373 A1 | 7/2020 | Umezaki |

FOREIGN PATENT DOCUMENTS

| | | |
|---|---|---|
| CN | 102968952 A | 3/2013 |
| JP | 2008-6371 A | 1/2008 |
| JP | 2013-50717 A | 3/2013 |
| KR | 10-2007-0016463 A | 2/2007 |
| KR | 10-0830981 | 5/2008 |
| KR | 10-2009-0054704 A | 6/2009 |
| KR | 10-2012-0019227 A | 3/2012 |

\* cited by examiner

DRIVING CIRCUIT AND DISPLAY DEVICE INCLUDING THE SAME

CROSS-REFERENCE TO RELATED APPLICATIONS

This application is a continuation of U.S. patent application Ser. No. 15/589,948, filed May 8, 2017, which is a divisional of U.S. patent application Ser. No. 14/340,142, filed Jul. 24, 2014, now U.S. Pat. No. 9,646,539, which claims priority to and the benefit of Korean Patent Application No. 10-2014-0017471, filed Feb. 14, 2014, the entire content of all of which is incorporated herein by reference.

BACKGROUND

1. Field

Aspects of example embodiments relate to a driving circuit and a display device including the same.

2. Description of the Related Art

A display device includes a driving circuit for generating a plurality of driving signals. The display device includes a plurality of pixels. Each pixel includes a light emitting element and a switch for supplying a driving current to the light emitting element. The driving signals include signals for controlling the switches. For example, the driving signals include a scan signal for controlling synchronizing of data writing and/or an initialization signal for initializing the pixels.

However, a delay characteristic of increase and decrease times of the signals inputted to the driving circuit in order to generate the driving signals may affect an action of the driving circuit and image quality of the display device.

The above information disclosed in this Background section is only for enhancement of understanding of the background of the invention, and therefore, it may contain information that does not form the prior art that is known to a person of ordinary skill in the art.

SUMMARY

Aspects of example embodiments relate to avoiding a delay of a signal and a voltage drop occurring in a wire, which may affect an action of a pixel circuit and image quality of a display device.

An example embodiment provides a scan driver including: a plurality of unit scan driving circuits, at least one of the plurality of unit scan driving circuits including: a first transistor configured to receive a prior scan signal in synchronization with a first clock signal and to respond to an enable level of the prior scan signal to output a second clock signal as a corresponding scan signal during one cycle of the first clock signal; a second transistor coupled between the first transistor and a first voltage in series; and a third transistor coupled to a gate of the second transistor and configured to be turned on by a first signal; a first wire configured to transfer the first clock signal; a second wire configured to transfer the second clock signal; and a thir wire configured to transfer the first signal. A width of the first wire and a width of the second wire are larger than a width of the third wire.

An electrode of the third transistor may be coupled to the gate of the second transistor, another electrode of the third transistor may be configured to receive a second voltage, a gate of the third transistor may be coupled to the third wire, and a width of a fourth wire configured to transfer the first voltage may be larger than a width of a fifth wire configured to transfer the second voltage.

Another example embodiment provides a scan driver including: a plurality of first unit scan driving circuits configured to receive a prior first scan signal in synchronization with a first clock signal and to respond to an enable level of the prior first scan signal to output a second clock signal as a corresponding first scan signal during one cycle of the first clock signal; a plurality of second unit scan driving circuits configured to receive the first scan signal in synchronization with a third clock signal and to respond to an enable level of the first scan signal to output a fourth clock signal as a corresponding second scan signal during one cycle of the third clock signal. A width of a first wire configured to transfer the third clock signal and a width of a second wire configured to transfer the fourth clock signal are larger than at least one of a width of a third wire configured to transfer the first clock signal and a width of a fourth wire configured to transfer the second clock signal.

Each of the plurality of first unit scan driving circuits may include: a first transistor including an electrode configured to receive the second clock signal, and a gate configured to receive the prior first scan signal; a second transistor including an electrode coupled to another electrode of the first transistor, and another electrode coupled to a first voltage; and a third transistor coupled between a gate electrode of the second transistor and a second voltage and configured to be turned on according to the first clock signal.

A width of a fifth wire configured to transfer the first voltage may be larger than a width of a sixth wire configured to transfer the second voltage.

Each of the plurality of second unit scan driving circuits may include: a first transistor including an electrode configured to receive the fourth clock signal, and a gate configured to receive the corresponding first scan signal; a second transistor including an electrode coupled to another electrode of the first transistor, and another electrode coupled to a first voltage; and a third transistor coupled between a gate electrode of the second transistor and a second voltage and configured to be turned on according to the third clock signal.

A width of a fifth wire configured to transfer the first voltage may be larger than a width of a sixth wire configured to transfer the second voltage.

Yet another example embodiment provides a scan driver including: a first wire configured to transfer a first clock signal; a second wire configured to transfer a first signal; a first transistor including an electrode coupled to the first wire; and a second transistor including a gate electrode coupled to the second wire. A width of the first wire is larger than a width of the second wire.

The scan driver may further include: a third wire configured to transfer a second clock signal; and a third transistor including an electrode coupled to the third wire. A width of the third wire may be larger than the width of the second wire.

The scan driver may further include a fourth transistor including a gate electrode coupled to the third wire. A gate electrode of the first transistor may be coupled to an electrode of the fourth transistor.

The scan driver may further include: a fourth wire configured to transfer a first voltage; a fifth wire configured to transfer a second voltage; and a fifth transistor including a gate electrode coupled to the second transistor, an electrode coupled to another electrode of the first transistor, and another electrode coupled to the fourth wire. A width of the fourth wire may be larger than a width of the fifth wire.

An electrode of the second transistor may be coupled to the fifth wire, and another electrode of the second transistor may be coupled to the gate electrode of the fifth transistor.

Still another example embodiment provides a scan driver including: a first wire configured to transfer a first clock signal; a second wire configured to transfer a second clock signal; a third wire configured to transfer a third clock signal; a first transistor including a gate electrode coupled to the first wire; a second transistor including a gate electrode coupled to an electrode of the first transistor; a third transistor including a gate electrode coupled to the third wire and an electrode coupled to an electrode of the second transistor; and a fourth transistor including a gate electrode coupled to another electrode of the third transistor, and an electrode coupled to the second wire. A signal is outputted through another electrode of the fourth transistor, and a width of the second wire is larger than a width of the first wire.

The scan driver may further include: a fifth transistor including a gate electrode coupled to the second wire; and a sixth transistor including a gate electrode coupled to an electrode of the fifth transistor, and an electrode coupled to the third wire. Another signal may be outputted through another electrode of the sixth transistor, and a width of the third wire may be larger than the width of the first wire.

The scan driver may further include: a seventh transistor including a gate electrode, an electrode coupled to another electrode of the fourth transistor, and another electrode coupled to a fourth wire configured to transfer a first voltage; and an eighth transistor including a gate electrode coupled to the gate electrode of the third transistor, an electrode coupled to a fifth wire configured to transfer a second voltage, and another electrode coupled to the gate electrode of the seventh transistor. A width of the fourth wire may be larger than a width of the fifth wire.

A further example embodiment provides a display device including: a scan driver configured to generate a plurality of scan signals; and a plurality of pixels configured to receive a plurality of data voltages according to the plurality of scan signals. The scan driver includes: a plurality of unit scan driving circuits, at least one of the plurality of unit scan driving circuits including: a first transistor configured to receive a prior scan signal in synchronization with a first clock signal and to respond to an enable level of the prior scan signal to output a second clock signal as a corresponding scan signal during one cycle of the first clock signal; a second transistor coupled between the first transistor and a first voltage in series; and a third transistor coupled to a gate of the second transistor and configured to be turned on by a first signal; a first wire configured to transfer the first clock signal; a second wire configured to transfer the second clock signal; and a third wire configured to transfer the first signal. A width of the first wire and a width of the second wire are larger than a width of the third wire.

An electrode of the third transistor may be coupled to the gate of the second transistor, another electrode of the third transistor may be configured to receive a second voltage, a gate of the third transistor may be coupled to the third wire, and a width of a fourth configured to transfer the first voltage may be larger than a width of a fifth wire configured to transfer the second voltage.

A still further example embodiment provides a display device including: a scan driver configured to generate a plurality of first scan signals and a plurality of second scan signals; and a plurality of pixels configured to receive a plurality of data voltages according to the plurality of second scan signals, and to be initialized according to the plurality of first scan signals. The scan driver includes: a plurality of first unit scan driving circuits configured to receive a prior first scan signal in synchronization with a first clock signal and to respond to an enable level of the prior first scan signal to output a second clock signal as a corresponding first scan signal during one cycle of the first clock signal; and a plurality of second unit scan driving circuits configured to receive the first scan signal in synchronization with a third clock signal and to respond to an enable level of the first scan signal to output a fourth clock signal as a corresponding second scan signal during one cycle of the third clock signal. A width of a first wire configured to transfer the third clock signal and a width of a second wire configured to transfer the fourth clock signal are larger than at least one of a width of a third wire configured to transfer the first clock signal and a width of a fourth wire configured to transfer the second clock signal.

Each of the plurality of first unit scan driving circuits may include: a first transistor including an electrode configured to receive the second clock signal, and a gate configured to receive the prior first scan signal; a second transistor including an electrode coupled to another electrode of the first transistor, and another electrode coupled to a first voltage; and a third transistor coupled between a gate electrode of the second transistor and a second voltage, and configured to be turned on according to the first clock signal.

Each of the plurality of second unit scan driving circuits may include: a first transistor including an electrode configured to receive the fourth clock signal, and a gate configured to receive the corresponding first scan signal; a second transistor including an electrode coupled to another electrode of the first transistor, and another electrode coupled to a first voltage; and a third transistor coupled between a gate electrode of the second transistor and a second voltage, and configured to be turned on according to the third clock signal.

According to aspects of example embodiments, a delay of a signal and a voltage drop occurring in a wire, which may affect an action of a pixel circuit and image quality of a display device, may be reduced or avoided.

DETAILED DESCRIPTION

Figure 1:
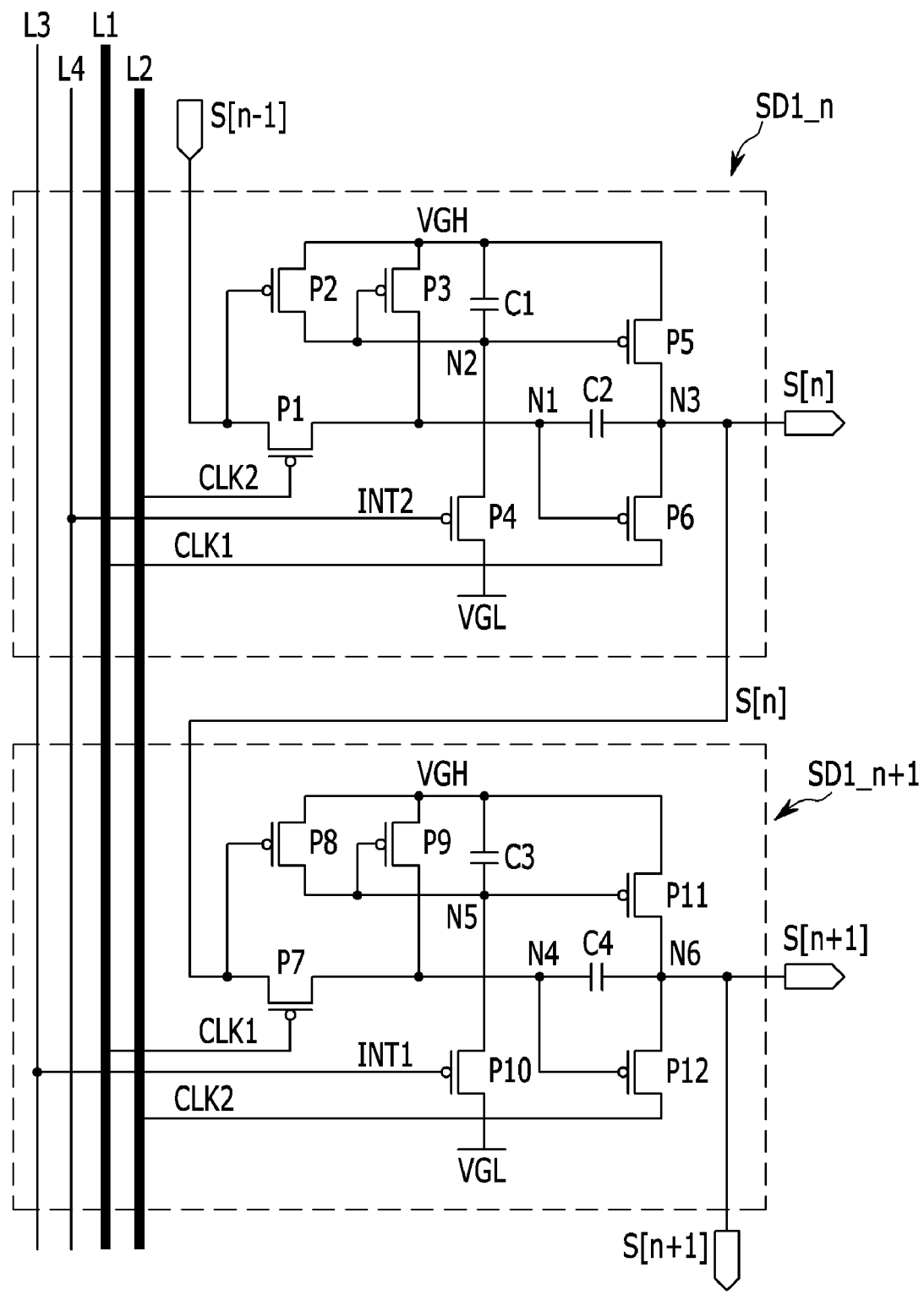
FIG. 1 is a view showing two consecutive stages in a scan driving circuit according to an example embodiment.

In the following detailed description, only certain example embodiments have been shown and described, simply by way of illustration. As those skilled in the art would realize, the described embodiments may be modified in various different ways, all without departing from the spirit or scope of the invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" or "indirectly coupled" to the other element through one or more intervening elements. In addition, unless explicitly described to the contrary, the word "comprise" and variations such as "comprises" or "comprising" will be understood to imply the inclusion of the stated elements but not the exclusion of any other elements.

Hereinafter, a driving circuit according to an example embodiment and a display device including the same will be described with reference to the drawings. Hereinafter, ordinal numbers described together with constituent elements are determined according to an order described in the specific content for carrying out the invention.

FIG. 1 is a view showing two consecutive stages in a scan driving circuit according to an example embodiment.

The scan driving circuit (e.g., scan driver) includes a plurality of consecutively arranged stages. Each stage (e.g., an n-th stage) receives a scan signal S[n−1] of an adjacent prior stage, generates a scan signal S[n] of a current stage, and outputs the scan signal S[n] to a next stage (e.g., an n+1-th stage). The next stage receives the scan signal (e.g., S[n]) and outputs the next scan signal (e.g., S[n+1]).

Hereinafter, each one of the plurality of stages constituting the scan driving circuit will be referred to as a unit scan driving circuit.

As shown in FIG. 1, a unit scan driving circuit SD1_n includes a plurality of transistors P1-P6 and two capacitors C1 and C2. A unit scan driving circuit SD1_n+1 includes a plurality of transistors P7-P12 and two capacitors C3 and C4.

The unit scan driving circuit SD1_n is synchronized with a clock signal CLK2 (e.g., in synchronization with a clock signal) to receive the scan signal S[n−1], and responds to an enable level of the scan signal S[n−1] to output a clock signal CLK1 as the scan signal S[n] during one cycle of the clock signal CLK2.

The unit scan driving circuit SD1_n+1 is synchronized with the clock signal CLK1 to receive the scan signal S[n], and responds to an enable level of the scan signal S[n] to output the clock signal CLK2 as the scan signal S[n+1] during one cycle of the clock signal CLK1.

Since the scan driving circuit according to an example embodiment is a P-channel transistor, the enable level of the scan signal has a low level. However, example embodiments of the present invention are not limited thereto, and the enable level is determined according to a transistor channel type of the driving circuit.

The clock signal CLK1 is transferred through a wire L1, and the clock signal CLK2 is transferred through a wire L2. An initialization signal INT1 is transferred through a wire L3, and an initialization signal INT2 is transferred through a wire L4.

The clock signal CLK2 is inputted to a gate of a transistor P1. The scan signal S[n−1] is inputted to an electrode of the transistor P1, and another electrode of the transistor P1 is coupled (e.g., connected) to a node N1.

The scan signal S[n−1] is inputted to a gate of a transistor P2. A source of the transistor P2 is coupled to a voltage VGH, and a drain of the transistor P2 is coupled to a node N2.

A gate of a transistor P3 is coupled to the node N2, a source of the transistor P3 is coupled to the voltage VGH, and a drain of the transistor P3 is coupled to the node N1.

The initialization signal INT2 is inputted to a gate of a transistor P4. A source of the transistor P4 is coupled to the node N2, and a drain of the transistor P4 is coupled to a voltage VGL.

A gate of a transistor P5 is coupled to the node N2, a source of the transistor P5 is coupled to the voltage VGH, and a drain of the transistor P5 is coupled to a node N3. The capacitor C1 is coupled between the gate and the source of the transistor P5 to maintain a gate-source voltage. When the transistor P5 is turned-on, the scan signal S[n] has a high level.

A gate of a transistor P6 is coupled to the node N1, and a source of the transistor P6 is coupled to the node N3. The clock signal CLK1 is inputted to a drain of the transistor P6. The capacitor C2 is coupled between the gate and the source of the transistor P6 to maintain the gate-source voltage.

The clock signal CLK1 is inputted to a gate of a transistor P7. The scan signal S[n] is inputted to an electrode of the transistor P7, and another electrode of the transistor P7 is coupled to the node N3.

The scan signal S[n] is inputted to a gate of a transistor P8. A source of the transistor P8 is coupled to the voltage VGH, and a drain of the transistor P8 is coupled to a node N5.

A gate of a transistor P9 is coupled to the node N5, a source of the transistor P9 is coupled to the voltage VGH, and a drain of the transistor P9 is coupled to a node N4.

The initialization signal INT1 is inputted to a gate of a transistor P10. A source of the transistor P10 is coupled to the node N5, and a drain of the transistor P10 is coupled to the voltage VGL.

A gate of a transistor P11 is coupled to the node N5, a source of the transistor P11 is coupled to the voltage VGH, and a drain of the transistor P11 is coupled to a node N6. The capacitor C3 is coupled between the gate and the source of the transistor P11 to maintain the gate-source voltage.

A gate of a transistor P12 is coupled to the node N4, and a source of the transistor P12 is coupled to the node N6. The clock signal CLK2 is inputted to a drain of the transistor P12. The capacitor C4 is coupled between the gate and the source of the transistor P12 to maintain the gate-source voltage.

When the clock signal CLK2 has a low level and the scan signal S[n−1] has a low level, the voltage of the node N1 has a low level, and thus the transistor P6 is turned on. In this case, the gate-source voltage of the transistor P6 is maintained by the capacitor C2. The clock signal CLK1 is outputted as the scan signal S[n] during a turn-on period of the transistor P6. When the clock signal CLK2 has a low level during a next cycle and the scan signal S[n−1] has a high level, the voltage of the node N1 has a high level, and thus the transistor P6 is turned off. When the voltage of the node N2 becomes the voltage VGL having a low level by the initialization signal INT2, the transistor P5 is turned on to allow the scan signal S[n] to have a high level.

When the clock signal CLK1 has a low level and the scan signal S[n] has a low level, the voltage of the node N4 has a low level, and thus the transistor P12 is turned on. In this case, the gate-source voltage of the transistor P12 is maintained by the capacitor C4. The clock signal CLK2 is outputted as the scan signal S[n+1] during a turn-on period of the transistor P12. When the clock signal CLK1 has a low level during a next cycle and the scan signal S[n] has a high level, the voltage of the node N4 has a high level, and thus the transistor P12 is turned off. When the voltage of the node N5 becomes the voltage VGL having a low level by the initialization signal INT1, the transistor P11 is turned on to allow the scan signal S[n+1] to have a high level.

As described above, the clock signals CLK1 and CLK2 may be output signals of the unit scan driving circuits SD1_$n$ and SD1_$n$+1. For example, in the unit scan driving circuit SD1_$n$, the clock signal CLK1 is outputted as the scan signal S[n] when the transistor P6 is in a turn-on state. In the unit scan driving circuit SD1_$n$+1, the clock signal CLK2 is outputted as the scan signal S[n+1] when the transistor P12 is in a turn-on state.

Then, an RC delay of the clock signals CLK1 and CLK2 transferred to the drains of the transistors P6 and P12 affects waveforms of the scan signals S[n] and S[n+1], which affects an action of a pixel circuit acting according to the scan signal. Moreover, the RC delay affects image quality of the display device including the unit scan driving circuit shown in FIG. 1.

On the other hand, the RC delay of the signals switching the transistor on/off does not relatively affect the waveform of the scan signal and the image quality of the display device as compared to the aforementioned clock signals.

For example, the RC delay of the initialization signals INT1 and INT2 transferred to the gates of the transistors P4 and P10 to switch the transistors P4 and P10 on/off does not affect an action of the pixel circuit.

Therefore, in the scan driving circuit according to an example embodiment, widths of the wires L1 and L2 through which the clock signals CLK1 and CLK2 are outputted as the scan signals are transferred, are larger than widths of wires of the other signals. For example, the widths of the wires L1 and L2 are larger than widths of the wires L3 and L4, through which the initialization signals INT1 and INT2 are transferred. Thus, resistance of the wires may be reduced to reduce the RC delay of the corresponding signal and to reduce or minimize influence of the signal on the action of the pixel circuit and the image quality of the display device due to the RC delay.

Figure 2:
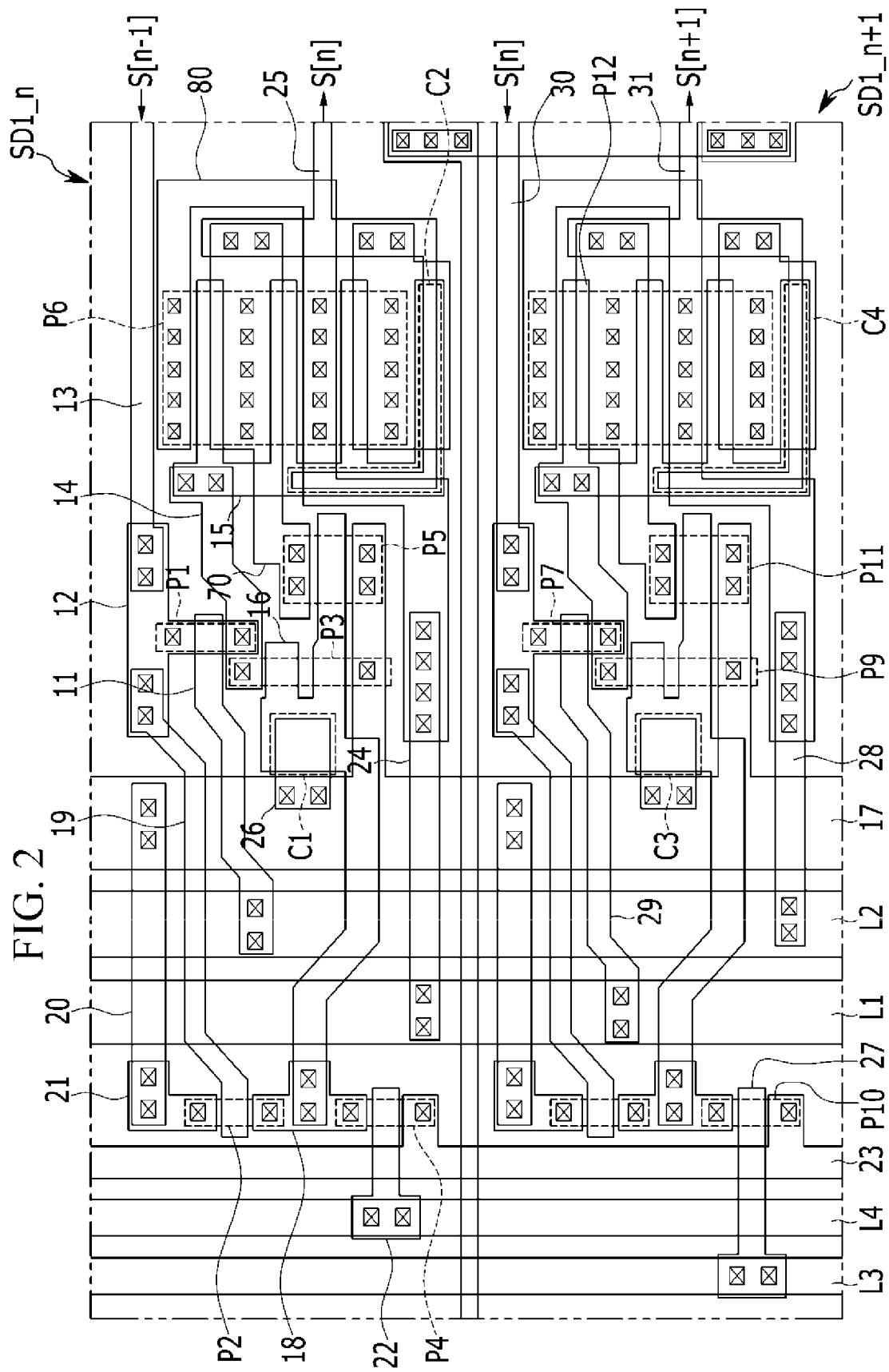
FIG. 2 is a view showing a layout of unit scan driving circuits shown in FIG. 1.

FIG. 2 is a view showing a layout of the unit scan driving circuits shown in FIG. 1.

As shown in FIG. 2, the widths of the wires L1 and L2, through which the clock signals CLK1 and CLK2 are transferred, are larger than the widths of the wires L3 and L4, through which the initialization signals INT1 and INT2 are transferred.

A gate electrode 11 of the transistor P1 is coupled (e.g., connected) through a contact hole to the wire L2. An electrode 12 of the transistor P1 is coupled through a contact hole to an electrode 13 to which the scan signal S[n−1] is transferred. An electrode 14 is another electrode of the transistor P1 and a drain electrode of the transistor P3, and is coupled to a gate electrode 15 of the transistor P6.

A gate electrode 16 is a gate electrode of the transistor P3 and of the transistor P5, and is coupled through a contact hole to an electrode 18. The source of the transistor P3 and the source of the transistor P5 are coupled through a contact hole to a wire 17. The wire 17 is a wire through which the voltage VGH is transferred. The electrode 18 is coupled to the drain of the transistor P2 and to the source of the transistor P4.

A gate electrode 19 of the transistor P2 is coupled through a contact hole to the electrode 12. An electrode 20 is coupled through a contact hole to the wire 17 and to a source electrode 21 of the transistor P2. A gate electrode 22 of the transistor P4 is coupled through a contact hole to the wire L4. A wire 23 is a wire through which the voltage VGL is transferred. The drain of the transistor P4 is coupled through a contact hole to the wire 23.

An electrode 80 is coupled through a contact hole to the drain of the transistor P6 and to an electrode 24. The electrode 24 is coupled through a contact hole to the wire L1. An electrode 70 is coupled through a contact hole to the drain of the transistor P5 and to the source of the transistor P6. An electrode 25 is coupled through a contact hole to the electrode 70. The scan signal S[n] is outputted through the electrode 25.

An electrode 26 is coupled through the contact hole to the wire 17. The capacitor C1 is formed in an overlapping region of the gate electrode 16 and the electrode 26. The capacitor C2 is formed in an overlapping region of the electrode 25 and the gate electrode 15 of the transistor P6.

The layout of the unit scan driving circuit SD1_$n$+1 is similar to the aforementioned layout of the unit scan driving circuit SD1_$n$, except for the following differences.

A gate electrode 27 of the transistor P10 is coupled through a contact hole to the wire L3. An electrode 28 is coupled through a contact hole to the wire L2. An electrode 29 is coupled through a contact hole to the wire L1. The scan signal S[n] is inputted through an electrode 30, and the scan signal S[n+1] is outputted through an electrode 31.

As shown in FIG. 2, the width of the wire 17 through which the voltage VGH is transferred is larger than the width of the wire 23 through which the voltage VGL is transferred. High level outputs of the scan signals outputted from the scan driving circuit constituted by the P channel transistor are supplied from the voltage VGH. Then, current consumption due to the voltage VGH is larger than current consumption due to the voltage VGL. In the example embodiment of FIG. 2, the width of the wire 17 of the voltage VGH is set to be larger than the width of the wire 23 of the voltage VGL, thus reducing resistance of the wire 17 having larger current consumption. Accordingly, power consumption may be reduced.

Figure 3:
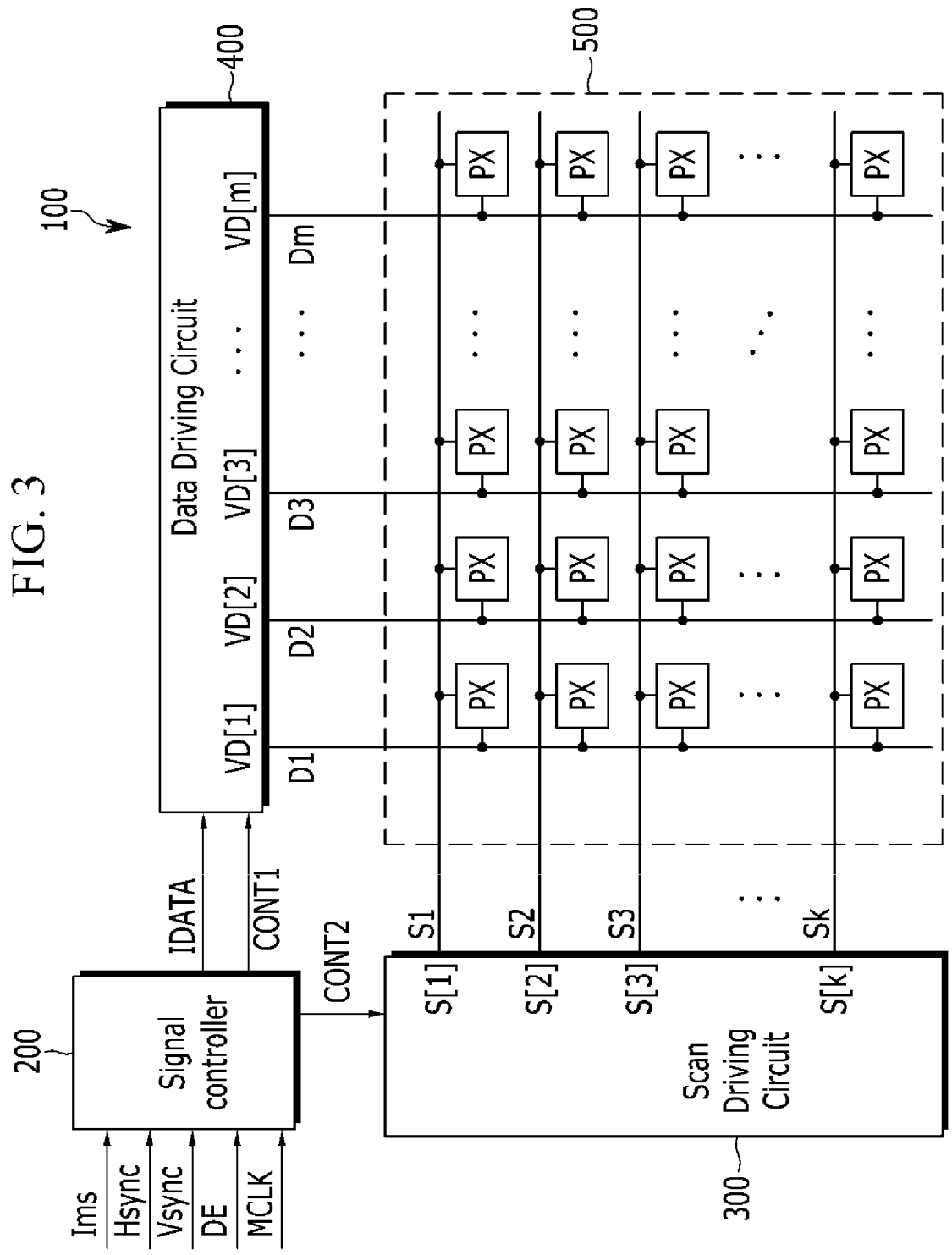
FIG. 3 is a view showing a display device including the scan driving circuit according to an example embodiment of the present invention.

FIG. 3 is a view showing a display device including the scan driving circuit according to an example embodiment of the present invention.

A display device 100 shown in FIG. 3 includes a signal controller 200, a scan driving circuit 300 (e.g., a scan driver), a data driving circuit 400 (e.g., a data driver), and a display unit 500.

The signal controller 200 generates a first driving control signal CONT1 and a second driving control signal CONT2 to control a display action of images according to a vertical synchronization signal Vsync for classifying frames of the images, a horizontal synchronization signal Hsync for classifying lines of one frame, a data enable signal DE for controlling an application period of a data voltage to a plurality of data lines D1-Dm, and a clock signal MCLK for controlling a driving frequency. The signal controller 200 receives a video signal Ims, generates image data IDATA, and transfers the image data DATA together with the first driving control signal CONT1 to the data driving circuit 400.

The data driving circuit 400 performs sampling and holding of an image data signal IDATA according to the first driving control signal CONT1. The data driving circuit 400 converts the image data signal IDATA into a plurality of data voltages VD[1]-VD[m], and transfers the image data signal to a plurality of data lines D1-Dm according to the first driving control signal CONT1.

The scan driving circuit 300 generates scan signals S[1]-S[k] corresponding to scan times corresponding to a plurality of scan lines S1-Sk by a low level pulse according to the second driving control signal CONT2, and transfers the scan signals S[1]-S[k] to the scan lines S1-Sk. The unit scan driving circuit described with reference to FIGS. 1 and 2 is applied to the scan driving circuit 300. For example, the scan driving circuit 300 includes k unit scan driving circuits.

The display unit 500 includes a plurality of scan lines S1-Sk, a plurality of data lines D1-Dm, and a plurality of pixels PX.

Each one of the plurality of scan lines S1-Sk is formed in a horizontal direction. Each one of the plurality of data lines D1-Dm is formed in a vertical direction.

Hereinafter, the pixel circuit according to an example embodiment will be described with reference to FIG. 4.

Figure 4:
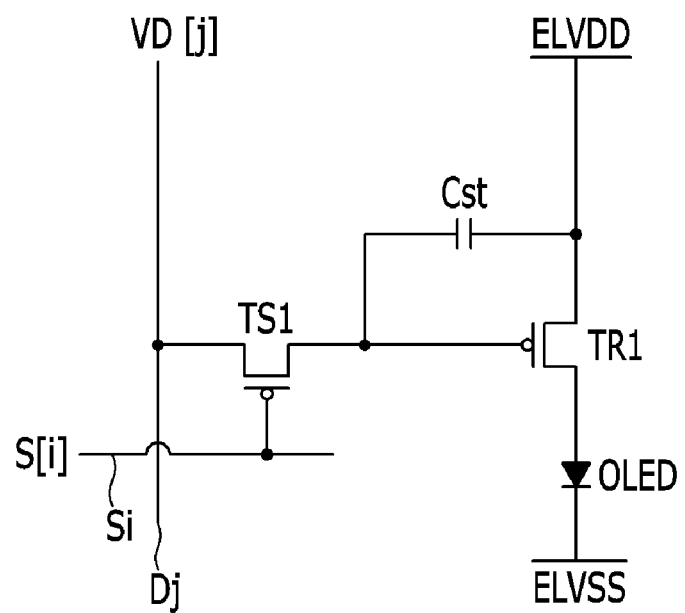
FIG. 4 is a view showing a pixel circuit according to an example embodiment.

FIG. 4 is a view showing a pixel circuit according to an example embodiment.

As shown in FIG. 4, the pixel PX includes a driving transistor TR1, a switching transistor TS1, a capacitor CST, and an organic light emitting diode OLED.

The pixel PX coupled (e.g., connected) to a data line Dj and a scan line S1 from among a plurality of pixels PX is shown in FIG. 4. A data voltage VD[j] is supplied through the data line Dj to the pixel PX. A scan signal S[i] is supplied through the scan line S1 to the pixel PX.

A source of the driving transistor TR1 is coupled to a power source voltage ELVDD, a gate of the driving transistor TR1 is coupled to an electrode of the switching transistor TS1, and a drain of the driving transistor T1 is coupled to an anode of the organic light emitting diode OLED.

A cathode of the organic light emitting diode OLED is coupled to a power source voltage ELVSS.

A gate of the switching transistor TS1 is coupled to the scan line Si, and the scan signal S[i] is supplied through the scan line Si. Another electrode of the switching transistor TS1 is coupled to the data line Dj.

An electrode of the capacitor CST is coupled to the gate of the driving transistor TR1, and another electrode of the capacitor CST is coupled to the power source voltage ELVDD.

When the switching transistor TS1 is turned on by the scan signal S[i], the data voltage VD[j] is transferred through the data line Dj to the gate of the driving transistor TR1. A gate-source voltage of the driving transistor TR1 is maintained by the capacitor CST, and the driving transistor TR1 generates a driving current according to the gate-source voltage. The organic light emitting diode OLED emits light according to the driving current.

Various example embodiments according to the present invention are feasible, and the present invention is not limited to the aforementioned example embodiments. Hereinafter, another example embodiment will be described with reference to FIGS. 5 to 8.

Figure 5:
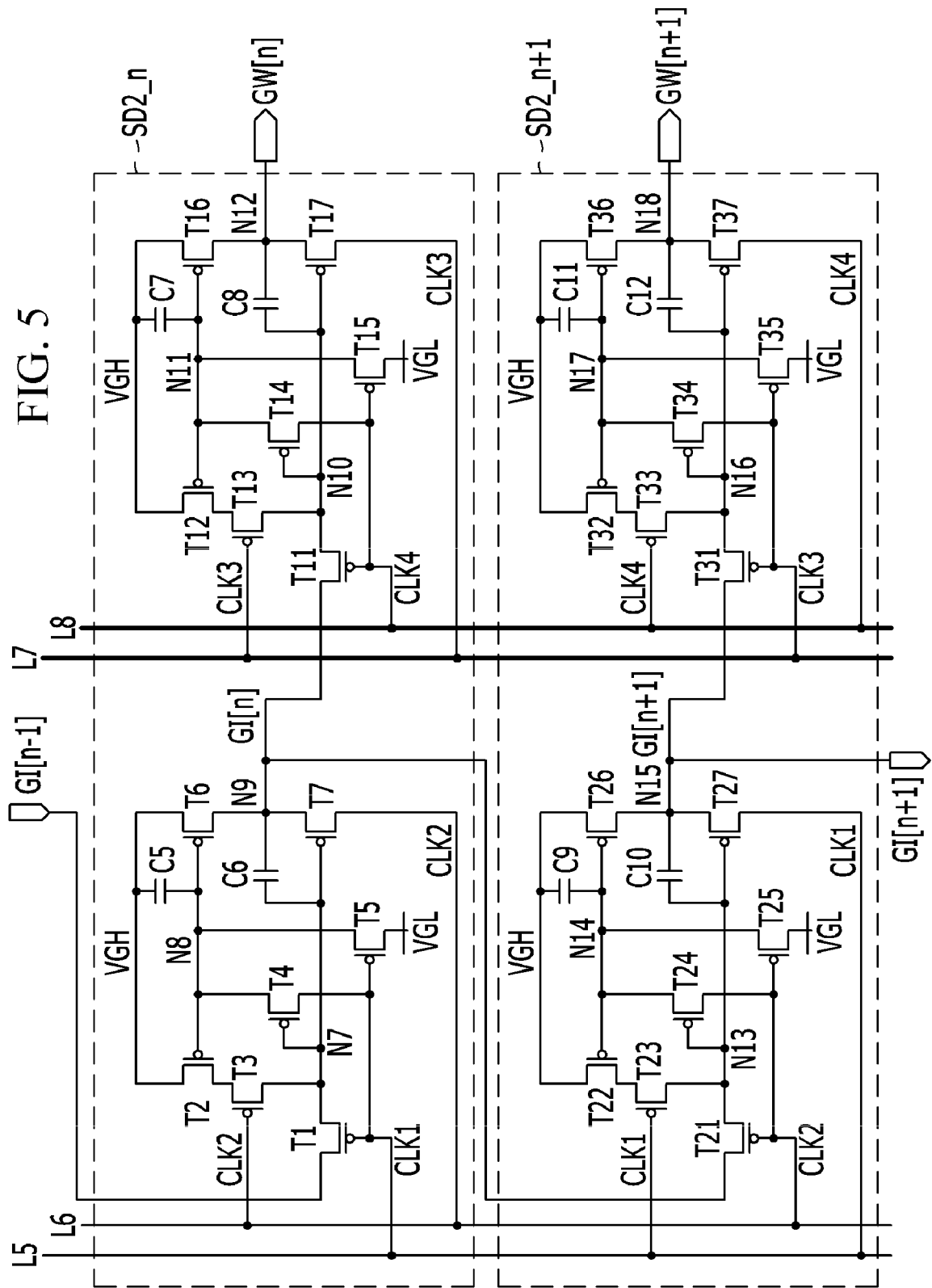
FIG. 5 is a view showing a scan driving circuit according to another example embodiment.

FIG. 5 is a view showing a scan driving circuit according to another example embodiment.

The scan driving circuit (e.g., scan driver) according to another example embodiment includes a plurality of consecutively arranged stages. Each stage (e.g., an n-th stage) receives a first scan signal GI[n−1] of an adjacent prior stage, generates a first scan signal GI[n] and a second scan signal GW[n] of a current stage, and outputs the first scan signal GI[n] to a next stage (e.g., an n+1-th stage). The next stage receives the first scan signal (e.g., GI[n]), and outputs a first scan signal GI[n+1] and a second scan signal GW[n+1].

Hereinafter, each one of the plurality of stages constituting the scan driving circuit according to another example embodiment will be referred to as a unit scan driving circuit.

As shown in FIG. 5, a unit scan driving circuit SD2_n includes a plurality of transistors T1-T7 and T11-T17, and four capacitors C5-C8. A unit scan driving circuit SD2_n+1 includes a plurality of transistors T21-T27 and T31-T37 and four capacitors C9-C12.

The unit scan driving circuit SD2_n is synchronized with a clock signal CLK1 (e.g., in synchronization with a clock signal) to receive the first scan signal GI[n−1], and responds to an enable level of the first scan signal GI[n−1] to output a clock signal CLK2 as the first scan signal GI[n] during one cycle of the clock signal CLK1. Further, the unit scan driving circuit SD2_n is synchronized with a clock signal CLK4 to receive the first scan signal GI[n], and responds to an enable level of the first scan signal GI[n] to output a clock signal CLK3 as the second scan signal GW[n] during one cycle of the clock signal CLK4.

The unit scan driving circuit SD2_n+1 is synchronized with the clock signal CLK2 to receive the first scan signal GI[n], and responds to an enable level of the first scan signal GI[n] to output the clock signal CLK1 as the first scan signal GI[n+1] during one cycle of the clock signal CLK2. Further, the unit scan driving circuit SD2_n+1 is synchronized with the clock signal CLK3 to receive the first scan signal GI[n+1], and responds to an enable level of the first scan signal GI[n+1] to output the clock signal CLK4 as the second scan signal GW[n+1] during one cycle of the clock signal CLK3.

Since the scan driving circuit according to an example embodiment is a P-channel transistor, the enable level of the scan signal is a low level. However, the present invention is not limited thereto, and the enable level is determined according to a transistor channel type of the driving circuit.

The clock signal CLK1 is transferred through a wire L5, and the clock signal CLK2 is transferred through a wire L6. The clock signal CLK3 is transferred through a wire L7, and the clock signal CLK4 is transferred through a wire L8.

The first scan signals (e.g., GI[n−1], GI[n], and GI[n+1] shown in FIG. 5) are signals for controlling an initialization action of the capacitor of the pixel circuit. The second scan signals (e.g., GW[n−1], GW[n], and GW[n+1] shown in FIG. 5) are signals for controlling threshold voltage compensation of the driving transistor, and a writing action of data on the capacitor in the pixel circuit. Influence of the second scan signal on an action of the pixel circuit and an image quality of the display device is larger than that of the first scan signal. Accordingly, in another example embodiment, widths of the wires L7 and L8, through which the clock signals CLK3 and CLK4 are transferred, are larger than those of the wires L5 and L6, through which the clock signals CLK1 and CLK2 are transferred. Thus, an increase/decrease time of the signal due to an RC delay may be improved.

The first scan signal GI[n−1] is inputted to an electrode of the transistor T1, the clock signal CLK1 is inputted to a gate of the transistor T1, and another electrode of the transistor T1 is coupled (e.g., connected) to a node N7.

The clock signal CLK2 is inputted to a gate of a transistor T3. A drain of the transistor T3 is coupled to the node N7, and a source of the transistor T3 is coupled to a drain of a transistor T2. A gate of the transistor T2 is coupled to a node N8, and a source of the transistor T2 is coupled to a voltage VGH.

A gate of a transistor T4 is coupled to the node N7, and a source of the transistor T4 is coupled to the node N8. The clock signal CLK1 is inputted to a drain of the transistor T4. The clock signal CLK1 is inputted to a gate of a transistor T5. A source of the transistor T5 is coupled to the node N8, and a drain of the transistor T5 is coupled to a voltage VGL.

A gate of a transistor T6 is coupled to the node N8, a source of the transistor T6 is coupled to the voltage VGH, and a drain of the transistor T6 is coupled to a node N9. A source of a transistor T7 is coupled to the node N9, and a gate of the transistor T7 is coupled to the node N7. The clock signal CLK2 is inputted to a drain of the transistor T7.

The capacitor C5 is coupled between the gate and the source of the transistor T6 to maintain a gate-source voltage of the transistor T6. The capacitor C6 is coupled between the gate and the source of the transistor T7 to maintain a gate-source voltage of the transistor T7.

The first scan signal GI[n] is inputted to an electrode of a transistor T11, the clock signal CLK4 is inputted to a gate of the transistor T11, and another electrode of the transistor T11 is coupled to a node N10.

The clock signal CLK3 is inputted to a gate of a transistor T13. A drain of the transistor T13 is coupled to the node N10, and a source of the transistor T13 is coupled to a drain of a transistor T12. A gate of the transistor T12 is coupled to a node N11, and a source of the transistor T12 is coupled to the voltage VGH.

A gate of a transistor T14 is coupled to the node N10, and a source of the transistor T14 is coupled to the node N11. The clock signal CLK4 is inputted to a drain of the transistor T14. The clock signal CLK4 is inputted to a gate of a transistor T15. A source of the transistor T15 is coupled to the node N11, and a drain of the transistor T15 is coupled to the voltage VGL.

A gate of a transistor T16 is coupled to the node N11, a source of the transistor T16 is coupled to the voltage VGH, and a drain of the transistor T16 is coupled to a node N12. A source of a transistor T17 is coupled to the node N12, and a gate of the transistor T17 is coupled to the node N10. The clock signal CLK3 is inputted to a drain of the transistor T17.

The capacitor C7 is coupled between the gate and the source of the transistor T16 to maintain a gate-source voltage of the transistor T16. The capacitor C8 is coupled between the gate and the source of the transistor T17 to maintain a gate-source voltage of the transistor T17.

The first scan signal GI[n] is inputted to an electrode of a transistor T21, the clock signal CLK2 is inputted to a gate of the transistor T21, and another electrode of the transistor T21 is coupled (e.g., connected) to a node N13.

The clock signal CLK1 is inputted to a gate of a transistor T23. A drain of the transistor T23 is coupled to the node N13, and a source of the transistor T23 is coupled to a drain of a transistor T22. A gate of the transistor T22 is coupled to a node N14, and a source of the transistor T22 is coupled to the voltage VGH.

A gate of a transistor T24 is coupled to the node N13, and a source of the transistor T24 is coupled to the node N14. The clock signal CLK2 is inputted to a drain of the transistor T24. The clock signal CLK2 is inputted to a gate of a transistor T25. A source of the transistor T25 is coupled to the node N14, and a drain of the transistor T25 is coupled to the voltage VGL.

A gate of a transistor T26 is coupled to the node N14, a source of the transistor T26 is coupled to the voltage VGH, and a drain of the transistor T26 is coupled to a node N15. A source of a transistor T27 is coupled to the node N15, and a gate of the transistor T27 is coupled to the node N13. The clock signal CLK1 is inputted to a drain of the transistor T27.

The capacitor C9 is coupled between the gate and the source of the transistor T26 to maintain a gate-source voltage of the transistor T26. The capacitor C10 is coupled between the gate and the source of the transistor T27 to maintain a gate-source voltage of the transistor T27.

The first scan signal GI[n+1] is inputted to an electrode of a transistor T31, the clock signal CLK3 is inputted to a gate of the transistor T31, and another electrode of the transistor T31 is coupled to a node N16.

The clock signal CLK4 is inputted to a gate of a transistor T33. A drain of the transistor T33 is coupled to the node N16, and a source of the transistor T33 is coupled to a drain of a transistor T32. A gate of the transistor T32 is coupled to a node N17, and a source of the transistor T32 is coupled to the voltage VGH.

A gate of a transistor T34 is coupled to the node N16, and a source of the transistor T34 is coupled to the node N17. The clock signal CLK3 is inputted to a drain of the transistor T34. The clock signal CLK3 is inputted to a gate of a transistor T35. A source of the transistor T35 is coupled to the node N17, and a drain of the transistor T35 is coupled to the voltage VGL.

A gate of a transistor T36 is coupled to the node N17, a source of the transistor T36 is coupled to the voltage VGH, and a drain of the transistor T36 is coupled to a node N18. A source of a transistor T37 is coupled to the node N18, and a gate of the transistor T37 is coupled to the node N16. The clock signal CLK4 is inputted to a drain of the transistor T37.

The capacitor C11 is coupled between the gate and the source of the transistor T36 to maintain a gate-source voltage of the transistor T36. The capacitor C12 is coupled between the gate and the source of the transistor T37 to maintain a gate-source voltage of the transistor T37.

When the clock signal CLK1 has a low level (the transistor T1 is turned on) and the first scan signal GI[n−1] has a low level, the voltage of the node N7 has a low level, and thus the transistor T7 is turned on. In this case, the gate-source voltage of the transistor T7 is maintained by the capacitor C6. The clock signal CLK2 is outputted as the first scan signal GI[n].

When the clock signal CLK1 has a low level during a next cycle and the first scan signal GI[n−1] has a high level, the voltage of the node N7 has a high level, and thus the transistor T7 is turned off. The transistor T5 is turned on and the voltage of the node N8 has a low level by the low level of the clock signal CLK1 to turn on the transistor T6. The first scan signal GI[n] becomes the voltage VGH having a high level by turning on the transistor T6.

When the clock signal CLK4 has a low level (the transistor T11 is turned on) and the first scan signal GI[n] has a low level, the voltage of the node N10 has a low level, and thus the transistor T17 is turned on. In this case, the gate-source voltage of the transistor T17 is maintained by the capacitor C8. The clock signal CLK3 is outputted as the second scan signal GW[n].

When the clock signal CLK4 has a low level during a next cycle and the first scan signal GI[n] has a high level, the voltage of the node N10 has a high level, and thus the transistor T17 is turned off. The transistor T15 is turned on and the voltage of the node N11 has a low level by the low level of the clock signal CLK4, to turn on the transistor T16. The second scan signal GW[n] becomes the voltage VGH having a high level by turning on the transistor T16.

When the clock signal CLK2 has a low level (the transistor T21 is turned on) and the first scan signal GI[n] has a low level, the voltage of the node N13 has a low level, and thus the transistor T27 is turned on. In this case, the gate-source voltage of the transistor T27 is maintained by the capacitor C10. The clock signal CLK1 is outputted as the first scan signal GI[n+1].

When the clock signal CLK2 has a low level during a next cycle and the first scan signal GI[n] has a high level, the voltage of the node N13 has a high level, and thus the transistor T27 is turned off. The transistor T25 is turned on and the voltage of the node N14 has a low level by the low level of the clock signal CLK2 to turn on the transistor T26. The first scan signal GI[n+1] becomes the voltage VGH having a high level by turning on the transistor T26.

When the clock signal CLK3 has a low level (the transistor T31 is turned on) and the first scan signal GI[n+1] has a low level, the voltage of the node N16 has a low level, and thus the transistor T37 is turned on. In this case, the gate-source voltage of the transistor T37 is maintained by the capacitor C12. The clock signal CLK4 is outputted as the second scan signal GW[n+1].

When the clock signal CLK3 has a low level during a next cycle and the first scan signal GI[n+1] has a high level, the voltage of the node N16 has a high level, and thus the transistor T37 is turned off. The transistor T35 is turned on and the voltage of the node N17 has a low level by the low level of the clock signal CLK3, to turn on the transistor T36. The second scan signal GW[n+1] becomes the voltage VGH having a high level by turning on the transistor T36.

As described above, the clock signals CLK3 and CLK4 may be the second scan signals GW[n] and GW[n+1] of the unit scan driving circuits SD2_n and SD2_n+1. Since the second scan signal affects the action of the pixel circuit and the image quality of the display device, the widths of the wires L7 and L8 are relatively larger than those of the other wires (e.g., L5 or L6). Thus, resistance of the wires may be reduced to reduce the RC delay of the corresponding signal and to reduce or minimize influence of the signal on the action of the pixel circuit and the image quality of the display device due to the RC delay.

Figure 6A:
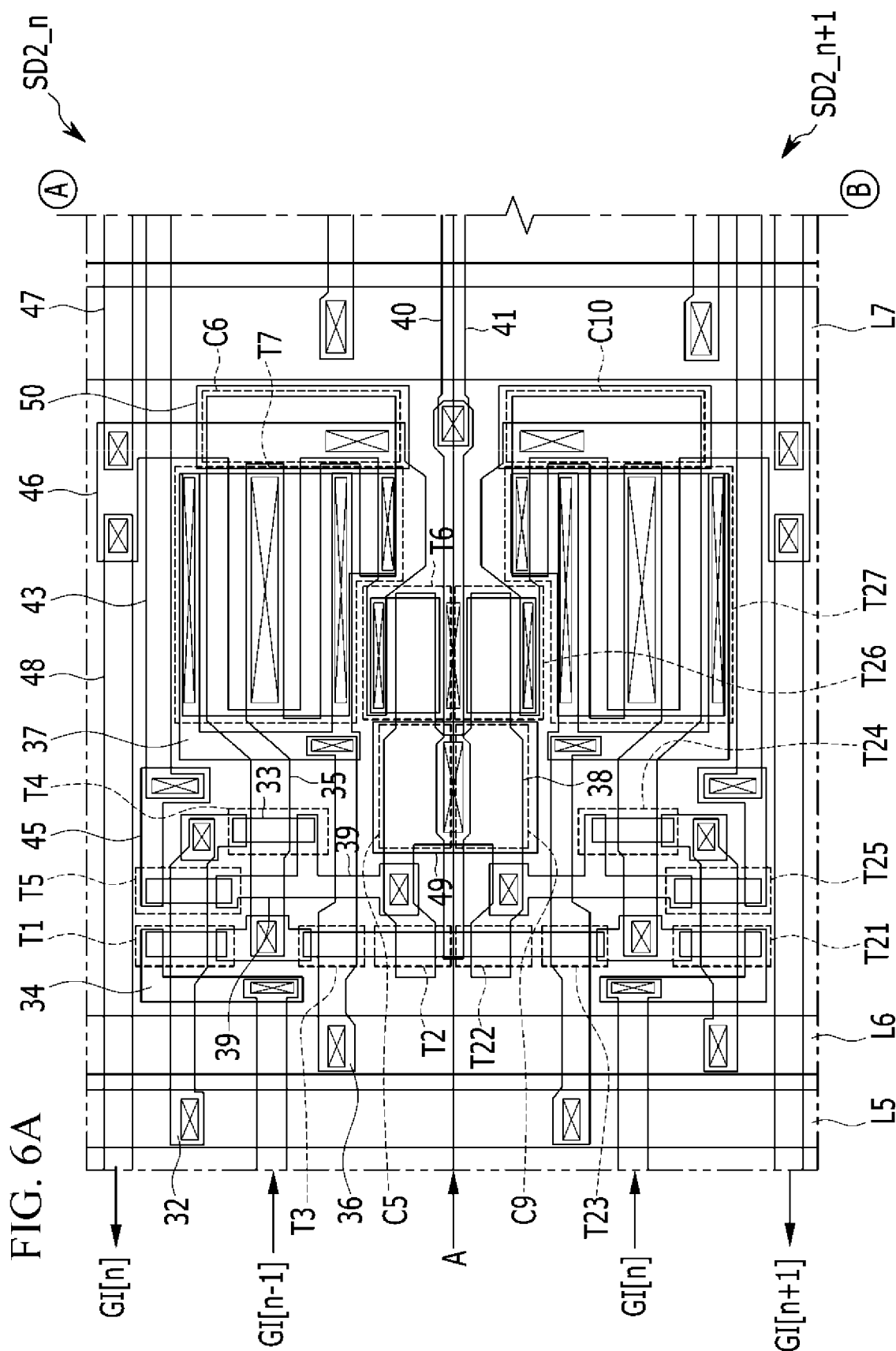
FIGS. 6A and 6B are views showing a layout of unit scan driving circuits shown in FIG. 5.
Figure 6B:
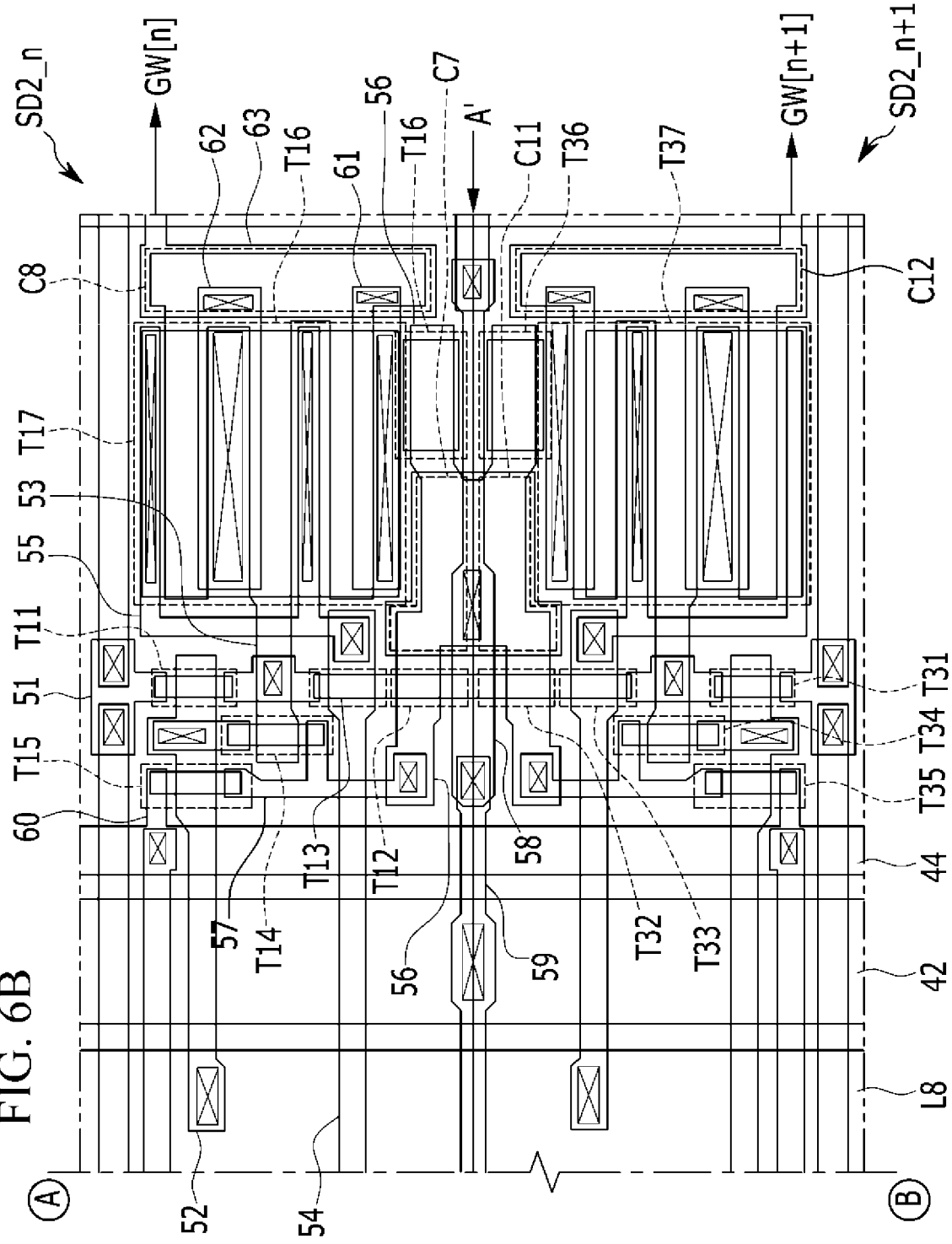

FIGS. 6A and 6B are views showing a layout of unit scan driving circuits shown in FIG. 5.

As shown in FIGS. 6A and 6B, the widths of the wires L7 and L8, through which the clock signals CLK3 and CLK4 are transferred, are larger than the widths of the wires L5 and L6, through which the clock signals CLK1 and CLK2 are transferred.

A gate electrode 32 is the gate of the transistor T1 and of the transistor T5. The gate electrode 32 is coupled (e.g., connected) through a contact hole to the wire L5, and is coupled through a contact hole to a drain electrode 33 of the transistor T4. An electrode 34 of the transistor T1 is coupled through a contact hole to a gate electrode 35. The first scan signal GI[n−1] is inputted through the gate electrode 35.

The gate electrode 35 is coupled through a contact hole to another electrode of the transistor T1, and is the gate of the transistor T7 and of the transistor T4. The drain of the transistor T3 is coupled through a contact hole to the gate electrode 35. A gate electrode 36 of the transistor T3 is coupled through a contact hole to the wire L6. The gate electrode 36 of the transistor T3 is coupled through a contact hole to an electrode 37. The electrode 37 is coupled through a contact hole to the drain of the transistor T7.

A gate electrode 38 is the gate of the transistor T2 and of the transistor T6, and is coupled through a contact hole to an electrode 39. The electrode 39 is coupled through a contact hole to the source of the transistor T5 and to the source of the transistor T4. An electrode 40 is coupled through a contact hole to an electrode 41. The electrode 41 is coupled through a contact hole to a wire 42. The voltage VGH is supplied through the wire 42.

An electrode 43 is coupled through a contact hole to a wire 44. An electrode 45 is coupled through a contact hole to the electrode 43, and the drain of the transistor T5 is coupled through a contact hole to the electrode 45.

The electrode 40 is coupled through a contact hole to the source of the transistor T6. An electrode 46 is coupled through a contact hole to the drain of the transistor T6. The electrode 46 is coupled through a contact hole to the source of the transistor T7.

An electrode 47 is coupled through a contact hole to the electrode 46. An electrode 48 is coupled through a contact hole to the electrode 46. The first scan signal GI[n] is outputted through the electrode 47 and the electrode 48 from the electrode 46.

The capacitor C5 is formed in an overlapping region of an electrode 49 and the gate electrode 38. The capacitor C6 is formed in an overlapping region of an electrode 50 and the gate electrode 35.

An electrode 51 of the transistor T11 is coupled through a contact hole to the electrode 47. A gate electrode 52 is coupled through a contact hole to the wire L8. The gate electrode 52 is the gate of the transistor T11 and the transistor T15. The gate electrode 52 is coupled through a contact hole to the drain of the transistor T14. The first scan signal GI[n] is inputted through the electrode 47 to the electrode 51.

A gate electrode 53 is the gate of the transistor T17 and the transistor T14. The gate electrode 53 is coupled through a contact hole to another electrode of the transistor T11. The drain of the transistor T13 is coupled through a contact hole to the gate electrode 53. A gate electrode 54 of the transistor T13 is coupled through a contact hole to the wire L7. The gate electrode 54 of the transistor T13 is coupled through a contact hole to an electrode 55. The electrode 55 is coupled through a contact hole to the drain of the transistor T17.

A gate electrode 56 is the gate of the transistor T12 and the transistor T16, and is coupled through a contact hole to an electrode 57. The electrode 57 is coupled through a contact hole to the source of the transistor T15 and to the source of the transistor T14. An electrode 58 is coupled through a contact hole to an electrode 59. The electrode 59 is coupled through a contact hole to the wire 42. The voltage VGH is supplied through the wire 42.

An electrode 60 is coupled through a contact hole to the wire 44. The drain of the transistor T15 is coupled through a contact hole to the electrode 60. The electrode 58 is coupled through a contact hole to the source of the transistor T16, and an electrode 61 is coupled through a contact hole to the drain of the transistor T16. The source of the transistor T17 is coupled through contact holes to electrodes 61 and 62.

The electrodes 61 and 62 are coupled through the contact holes to an electrode 63. The second scan signal GW[n] is outputted through the electrode 63.

The capacitor C7 is formed in an overlapping region of the gate electrode 56 and the electrode 63. The capacitor C8 is formed in an overlapping region of the gate electrode 53 and the electrode 63.

The layouts are substantially symmetric to each other based on a boundary line A-A'. From the description of the unit scan driving circuit SD2_n, the layout of the unit scan driving circuit SD2_n+1 may be sufficiently understood by a person having ordinary skill in the art. Therefore, a detailed description thereof has been omitted.

As shown in FIG. 6, the width of the wire 42 through which the voltage VGH is transferred is larger than the width of the wire 44 through which the voltage VGL is transferred. High level outputs of the scan signals outputted from the scan driving circuit constituted by the P-channel transistor are supplied from the voltage VGH. Then, current consumption due to the voltage VGH is larger than current consumption due to the voltage VGL. In the example embodiment of FIG. 6, the width of the wire 42 of the voltage VGH is set to be larger than the width of the wire 44 of the voltage VGL, thus reducing resistance of the wire 42 having larger current consumption. Accordingly, power consumption may be reduced.

Hereinafter, a display device according to another example embodiment will be described with reference to FIG. 7.

Figure 7:
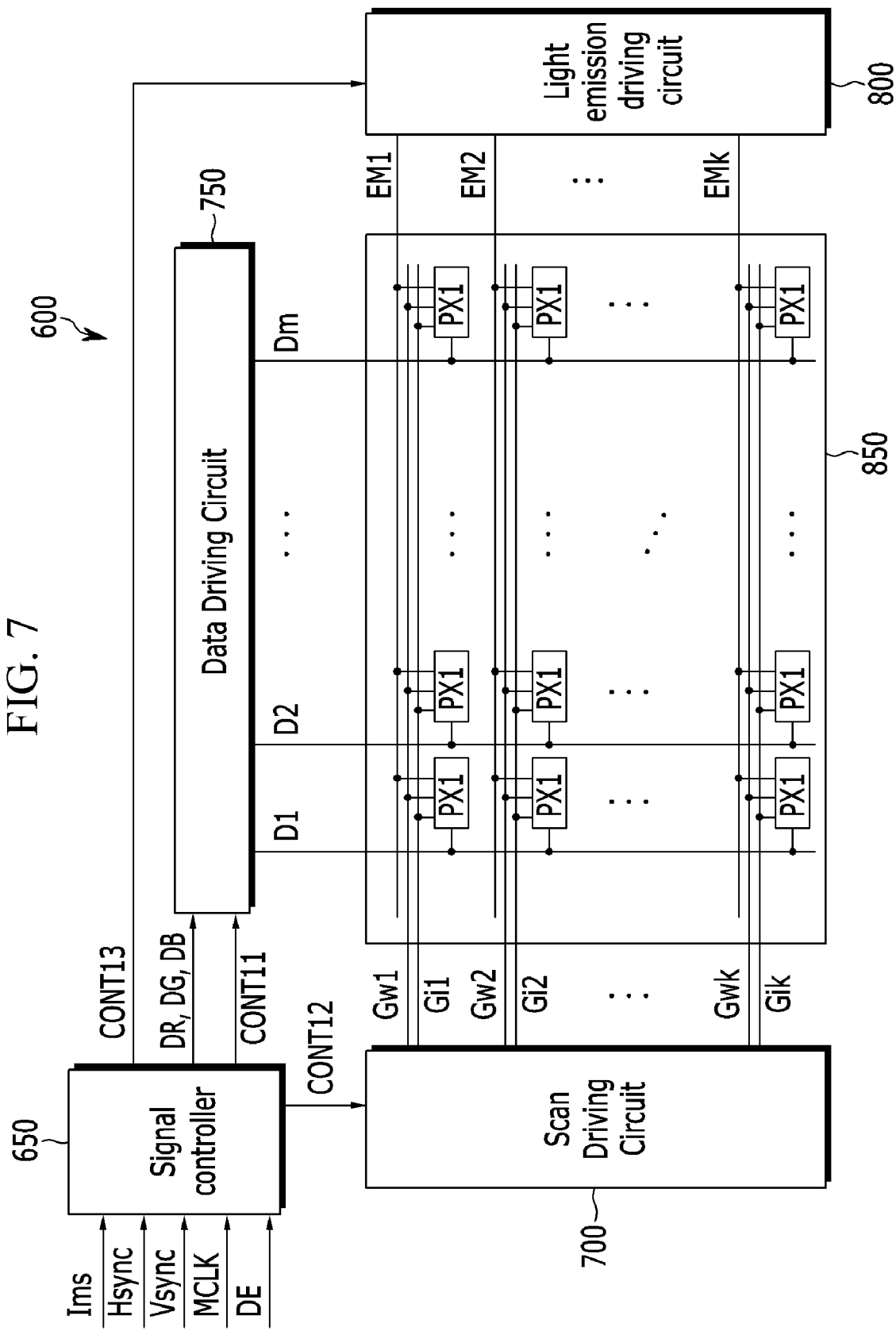
FIG. 7 is a view showing a display device according to another example embodiment.

FIG. 7 is a view showing a display device according to another example embodiment.

As shown in FIG. 7, a display device 600 according to another example embodiment includes a signal controller 650, a scan driving circuit 700 (e.g., a scan driver), a data driving circuit 750 (e.g., a data driver), a light emission driving circuit 800 (e.g., an emission driver), and a display unit 850.

The signal controller 650 generates a data control signal CONT11, a scan control signal CONT12, and a light emission control signal CONT13, to control a display action of images according to a vertical synchronization signal Vsync for classifying frames of the images, a horizontal synchronization signal Hsync for classifying lines of one frame, a data enable signal DE for controlling an application period of a data voltage to a plurality of data lines D1-Dm, and a clock signal MCLK for controlling a driving frequency.

The signal controller 650 processes a video signal Ims according to an action condition of the display unit 850 and the data driving circuit 750, to generate image data signals DR, DG, and DB. The signal controller 650 transfers the scan control signal CONT12 to the scan driving circuit 700, transfers the data control signal CONT11 and the image data signals DR, DG, and DB to the data driving circuit 750, and transfers the light emission control signal CONT13 to the light emission driving circuit 800.

The scan driving circuit 700 transfers a plurality of first and second scan signals to a plurality of scan lines Gi1-Gik and Gw1-Gwk, respectively, according to the scan control signal CONT12. The scan control signal CONT12 may include the clock signals CLK1-CLK4. The scan driving circuit 700 may include the unit scan driving circuits described with reference to FIGS. 5 and 6.

The data driving circuit 750 generates a plurality of data signals corresponding to the image data signals DR, DG, and DB, and transfers the data signals to a plurality of data lines D1-Dm according to the data control signal CONT11.

The light emission driving circuit 800 transfers a plurality of light emitting signals to a plurality of light emission control lines EM1-EMk according to the light emission control signal CONT13.

The display unit 850 includes a plurality of data lines D1-Dm extending in a column direction, a plurality of scan lines Gi1-Gik and Gw1-Gwk extending in a row direction, a plurality of light emission control lines EM1-EMk, and a plurality of pixels PX1. The plurality of data lines D1-Dm, the plurality of scan lines Gi1-Gik and Gw1-Gwk, and the light emission control lines EM1-EMk are coupled (e.g., connected) to the plurality of pixels PX1.

A plurality of data voltages are transferred through the plurality of data lines D1-Dm to the plurality of pixels PX1. The plurality of first and second scan signals for selecting the plurality of pixels PX1 in a row unit (e.g., row-by-row) are transferred through the plurality of first and second scan lines Gi1-Gik and Gw1-Gwk to the plurality of pixels PX1. The plurality of light emitting signals for controlling light emission of the plurality of pixels PX1 in a row unit are transferred through the plurality of light emission control lines EM1-EMk to the plurality of pixels PX1.

Figure 8:
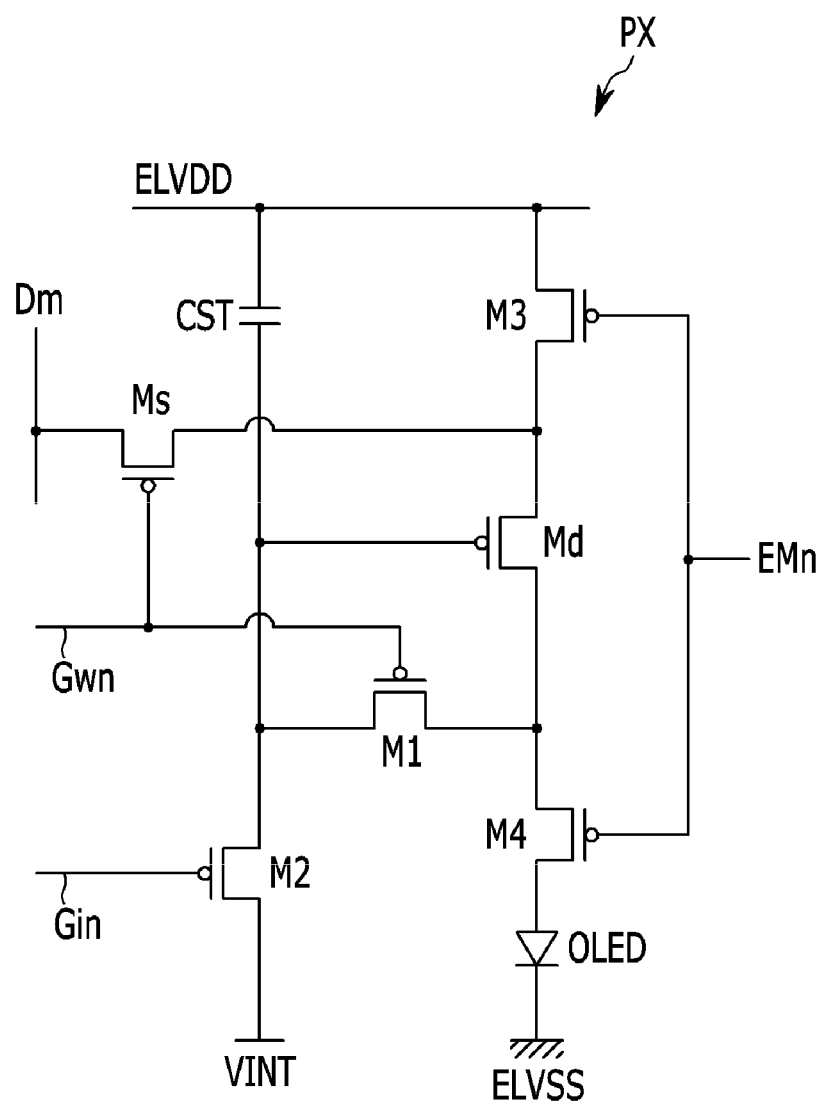
FIG. 8 is a view showing an example of one pixel from among a plurality of pixels according to another example embodiment.

FIG. 8 is a view showing an example of one pixel from among a plurality of pixels according to another example embodiment.

Referring to FIG. 8, one pixel PX1 according to another example embodiment is coupled to the n-th first and second scan lines Gin and Gwn, the n-th light emission control line EMn, and the m-th data line Dm.

The pixel PX includes a switching transistor Ms, a driving transistor Md, a plurality of transistors M1-M4, a capacitor CST, and an organic light emitting diode OLED. FIG. 8 shows the transistors Ms, Md, and M1-M4 as PMOS (P-channel metal oxide semiconductor) transistors as P-channel-type transistors. However, the present invention is not limited thereto, and another type of transistor may be used instead of the PMOS transistor.

The switching transistor Ms includes a gate coupled (e.g., connected) to the scan line Gwn, an electrode coupled to the data line Dm, and another electrode coupled to a source of the driving transistor Md. The switching transistor Ms transfers the data voltage applied to the data line Dm to the source of the driving transistor Md when turned on by the scan signal applied to the scan line Gwn.

The driving transistor Md includes the source to which the data voltage is transferred during a period when the switching transistor Ms is turned on, a gate coupled to an electrode of the capacitor CST, and a drain coupled to the source of the transistor M4. Another electrode of the capacitor CST is coupled to a power line to which a power source voltage ELVDD is applied.

The transistor M1 includes a gate coupled to the scan line Gwn, an electrode coupled to a gate electrode of the driving transistor Md, and another electrode coupled to a drain electrode of the driving transistor Md. The transistor M1 is turned on by the second scan signal GW[n] applied to the scan line Gwn to diode-couple (e.g., diode-connect) the driving transistor Md.

The transistor M2 includes a gate coupled to the scan line Gin, an electrode coupled to an initialization voltage VINT, and another electrode coupled to the gate of the driving transistor Md. The transistor M2 is turned on by the first scan signal GI[n] applied to the scan line Gin to initialize the capacitor CST.

The transistor M3 includes a gate coupled to the light emission control line EMn, a source coupled to the power line supplying the voltage ELVDD, and a drain coupled to the source of the driving transistor Md.

The transistor M4 includes a gate coupled to the light emission control line EMn, an electrode (e.g., source) coupled to the drain electrode of the driving transistor Md, and another electrode coupled to an anode electrode of the organic light emitting diode OLED. A cathode electrode of the organic light emitting diode OLED is coupled to the power line supplying the voltage ELVSS. The organic light emitting diode OLED emits light according to a current flowing through the driving transistor Md when the transistors M3 and M4 are turned on by the light emitting signal applied to the light emission control line EMn.

Figure 9:
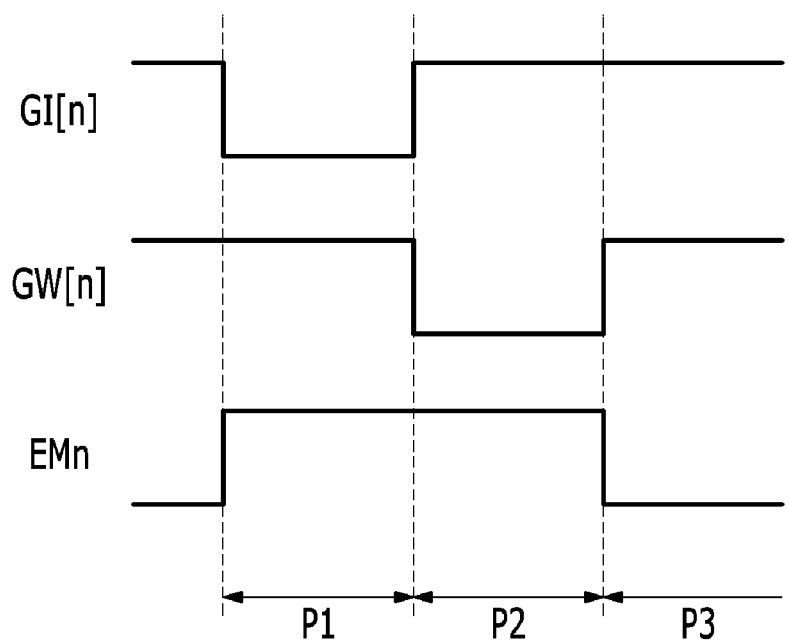
FIG. 9 is a view showing a waveform chart illustrating a timing for driving the pixel shown in FIG. 8.

FIG. 9 is a waveform chart illustrating a timing for driving the pixel shown in FIG. 8.

As shown in FIG. 9, the first scan signal GI[n] having a low level is applied during a period P1. Then, the transistor M2 is turned on, and thus the initialization voltage VINT is applied to the gate electrode of the driving transistor Md and the capacitor CST is charged with a voltage corresponding to ELVDD-VINT.

Next, the second scan signal GW[n] having a low level is applied during a period P2. Then, the switching transistor Ms and the transistor M1 are turned on. When the transistor M1 is turned on, the driving transistor Md is in a diode-coupled (e.g., diode-connected) state. Accordingly, a gate-source voltage of the transistor Md becomes a threshold voltage of the transistor Md.

In addition, the data voltage is applied from the data line Dm through the turned-on switching transistor Ms to the source of the driving transistor Md. When the data voltage from the data line Dm is Vdata, and the threshold voltage of the driving transistor Md is Vth (e.g., a negative voltage), the gate voltage of the driving transistor Md becomes Vdata+Vth. Then, the capacitor CST is charged with a voltage corresponding to ELVDD−(Vdata+Vth).

Next, the light emitting signal having a low level is applied to the light emission control line EMn during a period P3. Then, the transistors M3 and M4 are turned on, and a flowing driving current is transferred to the organic light emitting diode OLED according to a gate-source voltage difference (Vgs=(Vdata+Vth)−ELVDD)) of the driving transistor Md. In this case, the driving current is obtained by Equation 1.

$$I_{OLED} = \frac{\beta}{2}(Vgs - Vth)^2 = \frac{\beta}{2}((Vdata + Vth - ELVDD) - Vth)^2 = \frac{\beta}{2}(Vdata - ELVDD)^2 \quad \text{Equation 1}$$

In Equation 1, $I_{OLED}$ is a current flowing through the driving transistor Md to the organic light emitting diode OLED, and β is a constant value.

Contents disclosed in the detailed description of the present application are example embodiments for describing the spirit and scope of the present invention. While this invention has been described in connection with what is presently considered to be practical example embodiments, it is to be understood that the invention is not limited to the disclosed embodiments herein, but, on the contrary, is intended to cover various modifications and equivalent arrangements included within the spirit and scope of the appended claims, and their equivalents.

Description of Some of The Symbols
unit scan driving circuit SD1_*n*, SD1_*n*+1, SD2_*n*, SD2_*n*+1
transistor P1-P12, T1-T7, T11-T17, T21-T27, and T31-T37
capacitor C1-C12
wire L1-L8, 17, 23, 42, and 44
display device 100 and 600
signal controller 200 and 650
scan driving circuit 300 and 700
data driving circuit 400 and 750
display unit 500 and 850
light emission driving circuit 800
pixel PX and PX1

What is claimed is:

1. A scan driver comprising:
a plurality of unit scan driving circuits, at least one of the plurality of unit scan driving circuits comprising:
a first transistor configured to receive an input signal in synchronization with a first clock signal and to respond to an enable level of the input signal to output a second clock signal as a corresponding scan signal;
a first wire configured to transfer a first voltage;
a second wire configured to transfer a second voltage;
a second transistor electrically connected between the first transistor and the first wire; and
a third transistor electrically connected between a gate of the second transistor and the second wire;
wherein a width of the first wire is greater than a width of the second wire, and
wherein the first voltage and the second voltage are DC voltages, and the first voltage is higher than the second voltage.

2. The scan driver of claim 1, further comprising:
a third wire for transferring the first clock signal.

3. The scan driver of claim 2, wherein a gate of the third transistor is electrically connected to the third wire.

4. The scan driver of claim 1, further comprising:
a fourth transistor electrically connected between a gate of the first transistor and the first wire.

5. The scan driver of claim 4, wherein a gate of the fourth transistor is electrically connected to the gate of the second transistor.

6. The scan driver of claim 4, further comprising:
a fifth transistor electrically connected between the fourth transistor and the gate of the first transistor.

7. The scan driver of claim 6, further comprising:
a fourth wire for transferring the second clock signal.

8. The scan driver of claim 7, wherein a gate of the fifth transistor is electrically connected to the fourth wire.

9. The scan driver of claim 1, further comprising:
a sixth transistor electrically connected between a gate of the second transistor and a gate of the third transistor.

10. The scan driver of claim 9, wherein a gate of the sixth transistor is electrically connected to the gate of the first transistor.

11. The scan driver of claim 1, further comprising:
a seventh transistor to transfer the input signal to a gate of the first transistor in synchronization with the first clock signal.

12. The scan driver of claim 1, further comprising:
a first capacitor connected between a gate of the first transistor and a source electrode of the first transistor.

13. The scan driver of claim 1, further comprising:
a second capacitor connected between the gate of the second transistor and a source electrode of the second transistor.

14. A display device comprising:
a scan driver configured to generate a plurality of scan signals; and
a plurality of pixels to receive a plurality of data voltages according to the plurality of scan signals,
wherein the scan driver comprises:
a plurality of unit scan driving circuits, at least one of the plurality of unit scan driving circuits comprising:
a first transistor configured to receive an input signal in synchronization with a first clock signal and to respond to an enable level of the input signal to output a second clock signal as a corresponding scan signal;
a first wire configured to transfer a first voltage;
a second wire configured to transfer a second voltage;

a second transistor electrically connected between the first transistor and the first wire;

a third transistor electrically connected between a gate of the second transistor and the second wire;

wherein a width of the first wire is greater than a width of the second wire, and wherein the first voltage and the second voltage are DC voltages, and the first voltage is higher than the second voltage.

15. The display device of claim 14, further comprising: a fourth transistor electrically connected between a gate of the first transistor and the first wire.

16. The display device of claim 15, further comprising: a fifth transistor electrically connected between the fourth transistor and the gate of the first transistor.

17. The display device of claim 14, further comprising: a sixth transistor electrically connected between a gate of the second transistor and a gate of the third transistor.

18. The display device of claim 14, further comprising: a seventh transistor to transfer the input signal to a gate of the first transistor in synchronization with the first clock signal.

19. The display device of claim 14, further comprising: a first capacitor connected between the gate of the first transistor and a source electrode of the first transistor.

20. The display device of claim 14, further comprising: a second capacitor connected between the gate of the second transistor and a source electrode of the second transistor.

* * * * *